United States Patent
Hsu et al.

(10) Patent No.: US 7,539,065 B2
(45) Date of Patent: May 26, 2009

(54) METHOD OF PROGRAMMING NON-VOLATILE MEMORY

(75) Inventors: Cheng-Hsing Hsu, Hsinchu (TW); Hao-Ming Lien, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 35 days.

(21) Appl. No.: 11/930,132

(22) Filed: Oct. 31, 2007

(65) Prior Publication Data

US 2008/0056009 A1     Mar. 6, 2008

Related U.S. Application Data

(62) Division of application No. 11/160,561, filed on Jun. 29, 2005, now Pat. No. 7,392,529.

(51) Int. Cl.
*G11C 16/04* (2006.01)
(52) U.S. Cl. .......................... 365/185.28; 365/185.14; 365/185.15
(58) Field of Classification Search ............ 365/185.28
See application file for complete search history.

(56) References Cited

U.S. PATENT DOCUMENTS

| | | | | |
|---|---|---|---|---|
| 5,422,504 A | * | 6/1995 | Chang et al. | 365/185.15 |
| 6,133,098 A | * | 10/2000 | Ogura et al. | 438/267 |
| 6,255,166 B1 | * | 7/2001 | Ogura et al. | 438/257 |
| 6,433,382 B1 | * | 8/2002 | Orlowski et al. | 257/315 |
| 6,587,381 B2 | * | 7/2003 | Kanai et al. | 365/185.28 |
| 6,757,197 B2 | * | 6/2004 | Kamei | 365/185.23 |
| 7,057,931 B2 | * | 6/2006 | Lutze et al. | 365/185.18 |
| 7,170,129 B2 | * | 1/2007 | Kuo | 257/315 |
| 2007/0194366 A1 | * | 8/2007 | Kuo | 257/314 |
| 2008/0049517 A1 | * | 2/2008 | Hung et al. | 365/185.28 |

\* cited by examiner

*Primary Examiner*—Son L Mai
(74) *Attorney, Agent, or Firm*—Jianq Chyun IP Office

(57) ABSTRACT

A non-volatile memory having a gate structure, a pair of storage units and two assist gates is provided. The gate structure is disposed on the substrate. The storage units are disposed on the sidewalls of the gate structure. The assist gates are disposed on the respective sides of the gate structure and adjacent to the storage units. Each assist gate is shared between two adjacent memory cells. The gate structure, the storage units and the assist gates are electrically isolated from one another.

14 Claims, 7 Drawing Sheets

METHOD OF PROGRAMMING NON-VOLATILE MEMORY

CROSS-REFERENCE TO RELATED APPLICATION

This application is a divisional of an application Ser. No. 11/160,561, filed on Jun. 29, 2005 now U.S. Pat. No. 7,392,529, now allowed. The entirety of each of the above-mentioned patent applications is hereby incorporated by reference herein and made a part of this specification.

BACKGROUND OF THE INVENTION

1. Field of the Invention

The present invention relates to a memory and operating method thereof. More particularly, the present invention relates to a non-volatile memory and operating method thereof.

2. Description of the Related Art

Among the various types of non-volatile memory products, electrically erasable programmable read only memory (EEPROM) is a memory device that has been widely used inside personal computer systems and electron equipment. Data can be stored, read out or erased from the EEPROM many times and stored data are retained even after power supplying the devices is cut off.

Typically, the floating gates and the control gates of the EEPROM non-volatile memory are fabricated using doped polysilicon. When data is programmed into the memory, the electrons injected into the floating gate will be evenly distributed throughout the entire polysilicon floating gate layer. However, if the tunneling oxide layer underneath the polysilicon gate contains some defects, a leakage current may develop leading to possible reliability problems in the device.

To prevent problems in operating the EEPROM due to leakage current, the conventional method is to use a charge-trapping layer instead of the polysilicon floating gate. The charge-trapping layer is fabricated using silicon nitride, for example. In general, the silicon nitride charge-trapping layer is sandwiched between a silicon oxide layer on top and another silicon oxide layer below to form an oxide/nitride/oxide (ONO) composite dielectric layer within a stack gate structure. An EEPROM having this type of stack gate structure is known as a nitride read-only-memory (NROM).

However, in the conventional technique, the storage unit for holding electric charges is normally flattened on a surface. With the ever-increasing demand for a higher level of integration for the devices, this flattened configuration is an important barrier to the miniaturization of the NROM devices. Furthermore, it is difficult to erase the electrical charges accumulated close to the central location of the channel for a planar storage unit.

In addition, the source and drain regions in the substrate of a conventional non-volatile memory device is formed by performing a doping operation. Hence, the production cost is increased beside the addition of one more doping operation.

On the other hand, it is important to find a method capable of increasing the programming speed of a non-volatile memory device and reducing the current required to program the memory device.

SUMMARY OF THE INVENTION

Accordingly, at least one objective of the present invention is to provide a non-volatile memory capable of increasing the level of integration of the memory device and simplifying the production process.

At least a second objective of the present invention is to provide a method of programming a non-volatile memory that requires a smaller programming current.

At least a third objective of the present invention is to provide a method of programming a non-volatile memory that has a better convergence characteristic.

At least a fourth objective of the present invention is to provide a method of programming a non-volatile memory that programs data into the memory with a higher speed.

At least a fifth objective of the present invention is to provide a method of reading data from a non-volatile memory without the need to form a doped source region and drain region.

At least a sixth objective of the present invention is to provide a method of erasing data from a non-volatile memory that can minimize the difficulties of removing charges accumulated near the central location of a channel within a flat storage unit inside a conventional non-volatile memory.

To achieve these and other advantages and in accordance with the purpose of the invention, as embodied and broadly described herein, the invention provides a non-volatile memory. The non-volatile memory comprises a plurality of memory cells. Each memory cell further comprises a gate structure, a pair of storage units and two assist gates. The gate structure is disposed on the substrate. The storage units are disposed on the sidewalls of the gate structure. The assist gates are disposed on the respective sides of the gate structure and adjacent to the storage units. Each assist gate is shared between two adjacent memory cells. The gate structure, the storage units and the assist gates are electrically isolated from one another.

According to the aforementioned non-volatile memory in the embodiment of the present invention, the gate structure further comprises a gate and a gate dielectric layer disposed on the substrate.

According to the aforementioned non-volatile memory in the embodiment of the present invention, the gate dielectric layer is fabricated using silicon oxide.

According to the aforementioned non-volatile memory in the embodiment of the present invention, the storage units are fabricated using silicon nitride.

According to the aforementioned non-volatile memory in the embodiment of the present invention, the gate structure and the assist gates are fabricated using doped polysilicon.

A method of programming a non-volatile memory, in particular, a memory cell array. The memory cell array comprises at least a first memory cell and a second memory cell. Each memory cell comprises a first gate, a pair of storage units, a second gate and a third gate. The first gate is disposed on the substrate. The storage units are disposed on the respective sidewalls of the first gate. The second gate and the third gate are disposed on the respective sides of the first gate and adjacent to the storage units. The first gate, the storage units, the second gate and the third gate are electrically isolated from one another. The third gate of the first memory cell is the second gate of the second memory cell. To program data into the storage unit of the first memory cell close to the second memory cell, the following setup is made. A first inversion region is formed in the substrate underneath the first gate of the second memory cell and the third gate of the second memory cell. A second inversion region is formed in the substrate underneath the third gate of the first memory cell. A third inversion region is formed in the substrate underneath the second gate of the first memory cell. A first voltage is applied to the first inversion region and a second voltage is applied to the third inversion region such that the first voltage is smaller than the second voltage. A third voltage is applied to the first gate of the first memory cell. Thus, source-side injection (SSI) is initiated to program data into the selected storage unit.

According to the aforementioned method of programming a non-volatile memory in the embodiment of the present invention, the second inversion region includes a floating inversion region.

According to the aforementioned method of programming a non-volatile memory in the embodiment of the present invention, the method of forming the second inversion region includes applying a fifth voltage to the third gate of the first memory cell.

According to the aforementioned method of programming a non-volatile memory in the embodiment of the present invention, the method of forming the first inversion region includes applying a fourth voltage to the first gate of the second memory cell.

According to the aforementioned method of programming a non-volatile memory in the embodiment of the present invention, the method of forming the third inversion region includes applying a sixth voltage to the second gate of the first memory cell.

According to the aforementioned method of programming a non-volatile memory in the embodiment of the present invention, a seventh voltage is also applied to the substrate.

A method of programming a non-volatile memory, in particular, a memory cell array. Each memory cell comprises a first gate, a pair of storage units and a pair of second gates. The first gate is disposed on the substrate. The storage units are disposed on the respective sidewalls of the first gate. The second gates are disposed on the respective sides of the first gate and adjacent to the storage units. Each second gate is shared between two adjacent memory cells. The first gate, the storage units and the second gates are electrically isolated from one another. To program data into the storage unit on one side of the memory cell, the following setup is made. A first inversion region is formed in the area underneath the second gate that lies above the selected memory cell on the same side as the selected storage unit. A second inversion region is formed in the area underneath the second gate on the other side of the selected memory cell. A first voltage is applied to the first inversion region and a second voltage is applied to the second inversion region such that the first voltage is greater than the second voltage. A third voltage is applied to the first gate of the selected memory cell. Thus, channel hot electron injection (CHEI) is triggered to program data into the selected storage unit.

According to the aforementioned method of programming a non-volatile memory in the embodiment of the present invention, the method of forming the first inversion region includes applying a fourth voltage to the second gate that lies above the selected memory cell and adjacent to the same side as the selected storage unit.

According to the aforementioned method of programming a non-volatile memory in the embodiment of the present invention, the method of forming the second inversion region includes applying a fifth voltage to the second gate on the other side of the selected memory cell.

According to the aforementioned method of programming a non-volatile memory in the embodiment of the present invention, a sixth voltage is also applied to the substrate.

A method of programming a non-volatile memory, in particular, a memory cell array. Each memory cell comprises a first gate, a pair of storage units and a pair of second gates. The first gate is disposed on the substrate. The storage units are disposed on the respective sidewalls of the first gate. The second gates are disposed on the respective sides of the first gate and adjacent to the storage units. Each second gate is shared between two adjacent memory cells. The first gate, the storage units and the second gates are electrically isolated from one another. To program data into the storage unit on one side of the memory cell, the following setup is made. A first inversion region is formed in the area underneath the second gate that lies above the selected memory cell on the same side as the selected storage unit. A second inversion region is formed in the area underneath the second gate on the other side of the selected memory cell. A first voltage is applied to the first inversion region and a second voltage is applied to the second inversion region such that the first voltage is greater than the second voltage. A third voltage is applied to the first gate of the selected memory cell. Thus, channel initiated secondary hot electron injection (CHISEL) is triggered to program data into the selected storage unit.

According to the aforementioned method of programming a non-volatile memory in the embodiment of the present invention, the method of forming the first inversion region includes applying a fourth voltage to the second gate that lies above the selected memory cell and adjacent to the same side as the selected storage unit.

According to the aforementioned method of programming a non-volatile memory in the embodiment of the present invention, the method of forming the second inversion region includes applying a fifth voltage to the second gate on the other side of the selected memory cell.

According to the aforementioned method of programming a non-volatile memory in the embodiment of the present invention, a sixth voltage is also applied to the substrate.

A method of reading data from a non-volatile memory, in particular, a memory cell array. Each memory cell comprises a first gate, a pair of storage units and a pair of second gates. The first gate is disposed on the substrate. The storage units are disposed on the respective sidewalls of the first gate. The second gates are disposed on the respective sides of the first gate and adjacent to the storage units. Each second gate is shared between two adjacent memory cells. The first gate, the storage units and the second gates are electrically isolated from one another. To read data from the storage unit on one side of the memory cell, the following set up is made. A first inversion region is formed in the area underneath the second gate that lies above the selected memory cell on the same side as the selected storage unit. A second inversion region is formed in the area underneath the second gate on the other side of the selected memory cell. A first voltage is applied to the first inversion region and a second voltage is applied to the second inversion region. A third voltage is applied to the first gate of the selected memory cell. Thus, data is read from the selected storage unit.

According to the aforementioned method of reading from a non-volatile memory in the embodiment of the present invention, the method of forming the first inversion region includes applying a fourth voltage to the second gate that lies above the selected memory cell and adjacent to the same side as the selected storage unit.

According to the aforementioned method of reading from a non-volatile memory in the embodiment of the present invention, the method of forming the second inversion region includes applying a fifth voltage to the second gate on the other side of the selected memory cell.

According to the aforementioned method of reading from a non-volatile memory in the embodiment of the present invention, a sixth voltage is also applied to the substrate.

A method of erasing data from a non-volatile memory, in particular, a memory cell array. Each memory cell comprises a first gate, a pair of storage units and a pair of second gates.

The first gate is disposed on the substrate. The storage units are disposed on the respective sidewalls of the first gate. The second gates are disposed on the respective sides of the first gate and adjacent to the storage units. Each second gate is shared between two adjacent memory cells. The first gate, the storage units and the second gates are electrically isolated from one another. To erase data from the storage unit on one side of the memory cell, the following set up is made. A first inversion region is formed in the area underneath the second gate that lies above the selected memory cell on the same side as the selected storage unit. A second inversion region is formed in the area underneath the second gate on the other side of the selected memory cell. A first voltage is applied to the first inversion region and a second voltage is applied to the second inversion region such that the first voltage is larger than the second voltage. A third voltage is applied to the first gate of the selected memory cell. Thus, band-to-band hot hole effect is triggered to erase data from the selected storage unit.

According to the aforementioned method of erasing data from a non-volatile memory in the embodiment of the present invention, the method of forming the first inversion region includes applying a fourth voltage to the second gate that lies above the selected memory cell and adjacent to the same side as the selected storage unit.

According to the aforementioned method of erasing data from a non-volatile memory in the embodiment of the present invention, the method of forming the second inversion region includes applying a fifth voltage to the second gate on the other side of the selected memory cell.

According to the aforementioned method of erasing data from a non-volatile memory in the embodiment of the present invention, a sixth voltage is also applied to the substrate.

The present invention utilizes an inversion word line formed by the application of a voltage to the substrate to replace the conventional source region and drain region formed by a doping process. Therefore, the level of integration of the memory device is increased and the manufacturing process is simplified to reduce overall production cost.

Furthermore, the method of operating the non-volatile memory in the present invention can increase overall programming speed and reduce overall programming current and provides a better convergence characteristic. In addition, the erasing operation according to the present invention can eliminate the problem of having difficulties erasing the accumulated charges close to the central region of the channel within the planar storage unit of a conventional non-volatile memory.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
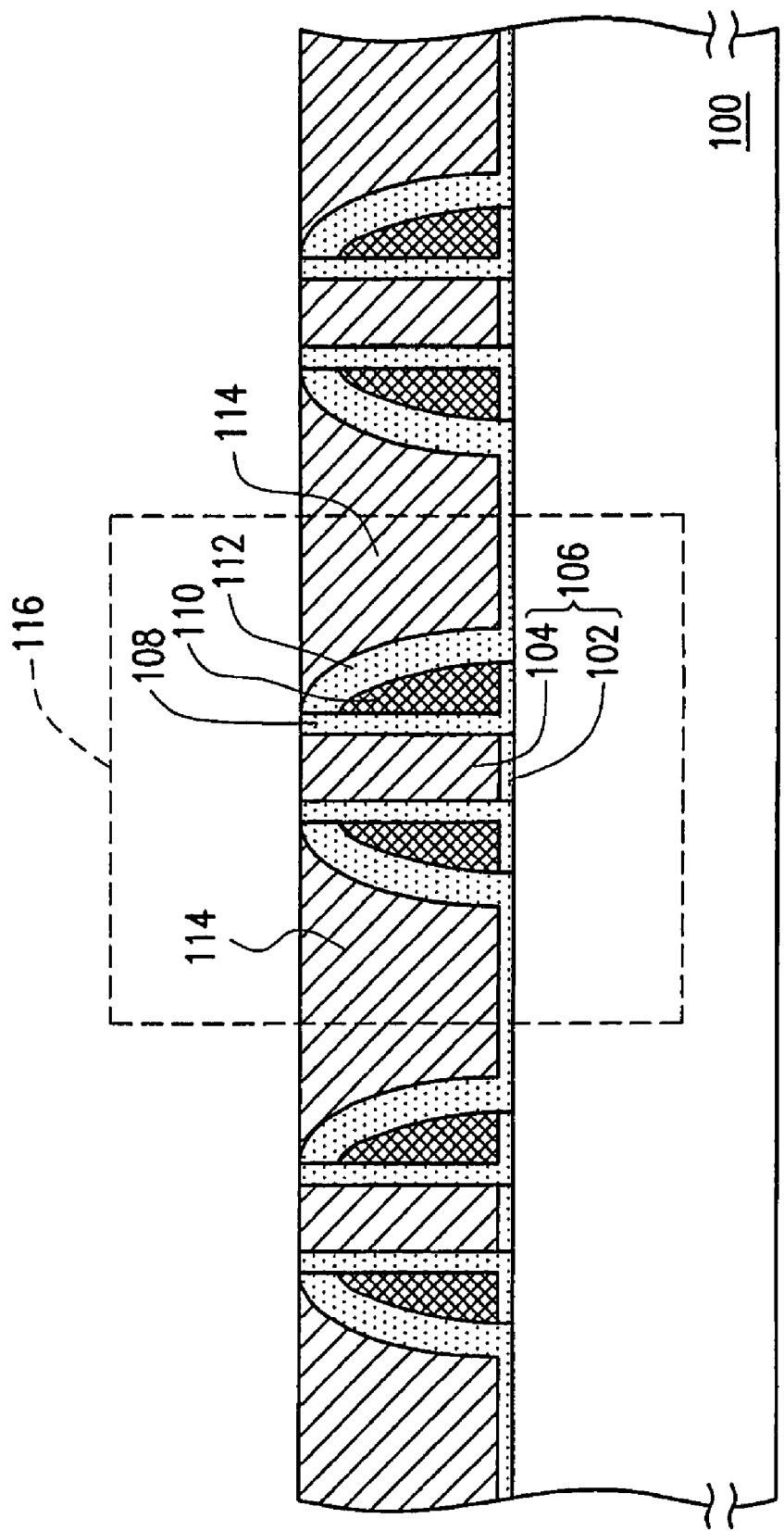
FIG. 1 is a schematic cross-sectional view of a non-volatile memory according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of a non-volatile memory according to one embodiment of the present invention. As shown in FIG. 1, the non-volatile memory in the present invention comprises a plurality of memory cells 116. Each memory cell has a gate structure 106, a pair of storage units 110 and a pair of assist gates 114. The gate structure 106 is disposed on a semiconductor substrate 100. The gate structure 106 comprises a gate dielectric layer 102 and a gate 104, for example. The gate dielectric layer 102 is a silicon oxide layer formed, for example, by performing a thermal oxidation process. The gate 104 is a doped polysilicon layer formed, for example, by performing a chemical vapor deposition process with in-situ doping to form a doped polysilicon layer (not shown) and patterning the doped polysilicon thereafter.

The storage units 110 are disposed on the respective sidewalls of the gate structure 106. The storage unit 110 is a silicon nitride layer formed, for example, by globally depositing silicon nitride material over the semiconductor substrate 100 to cover the gate structure 106 and performing an anisotropic etching operation to form spacer-like storage units 110 thereafter.

The assist gates 114 are disposed on the respective sides of the gate structure 106 and adjacent to the storage units 110 on each side of the gate structure 106. Each assist gate 114 is shared between two adjacent memory cells 116. The assist gate 114 is a doped polysilicon layer, for example. To form the assist gates 114, a doped polysilicon layer (not shown) is globally formed over the semiconductor substrate 100 to cover the gate structure 106 and the storage units 110 and fill the gate between the gate structures 106. Then, a chemical-mechanical polishing operation is carried out using the gate 104 as a polishing stop layer. It should be noted that the gate structure 106, the storage units 110 and the assist gates 114 are electrically isolated from one another. For example, a dielectric layer 108 is set up between the gate structure 106 and the storage units 110 and between the storage units 110 and the semiconductor substrate 100. Another dielectric layer 112 is set up between the storage units 110 and the assist gates 114 and between the assist gates 114 and the semiconductor substrate 100. The dielectric layer 108 and the dielectric layer 112 are fabricated from silicon oxide, for example.

The aforementioned storage units 110 differ from the planar storage unit of a conventional non-volatile memory. For example, the storage units 110 are disposed as spacer-like elements on each side of the gate 104. Consequently, the dimensions of each memory cell can be reduced and the storage density of the memory can be increased significantly.

Furthermore, the memory device in the aforementioned embodiment of the present invention does not use a doped region to serve as a source region or a drain region. Instead, a voltage applied to the gate 104 and the assist gate 114 is used to produce an inversion word line in the semiconductor substrate 100. Thus, the method of fabricating the non-volatile memory is simplified and overall production cost is reduced.

In the following, the methods of operating the non-volatile memory are described in more detail. FIGS. 2 through 6 are schematic cross-sectional views according to the embodiments of the present invention.

Figure 2:
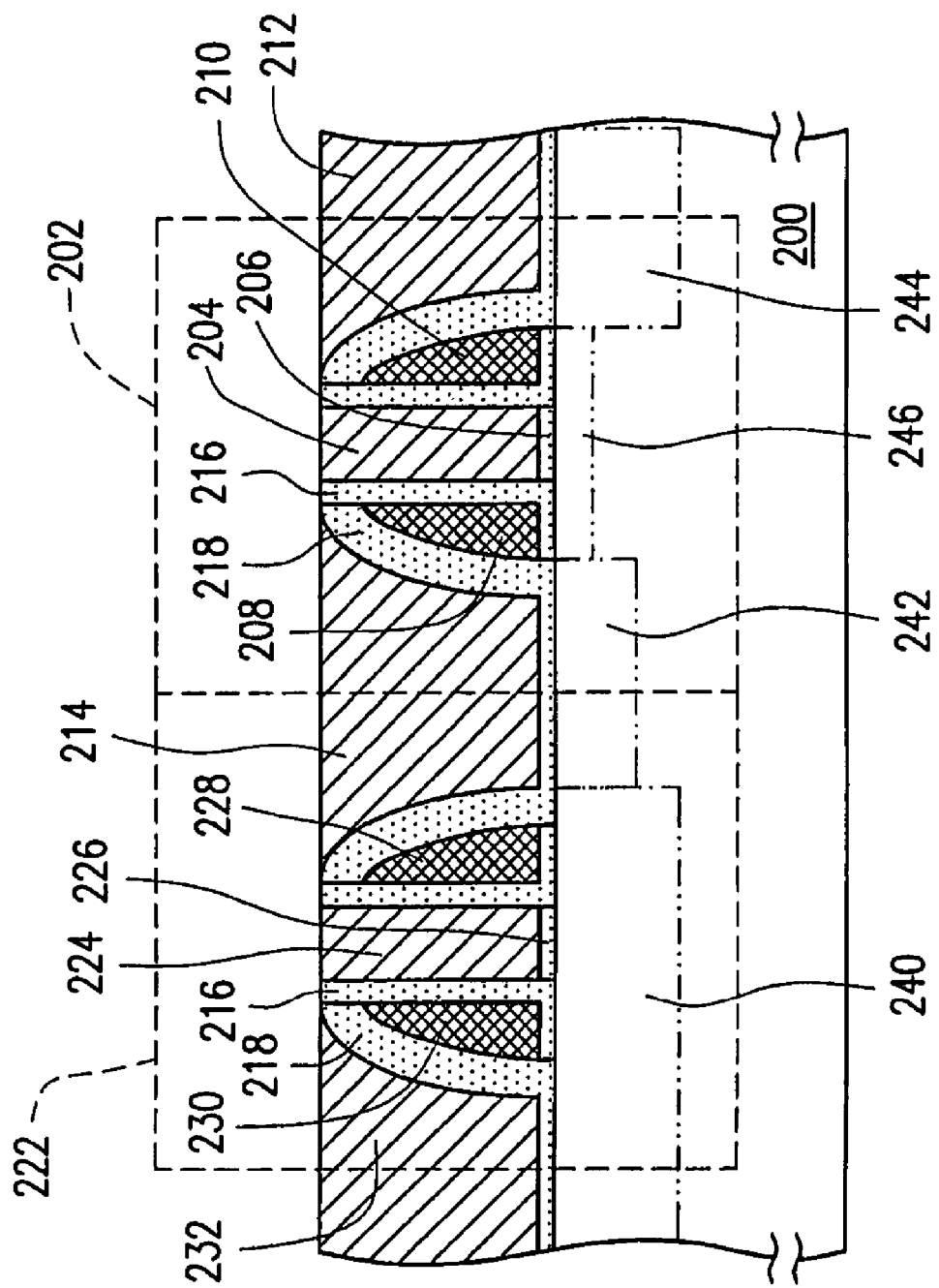
FIG. 2 is a schematic cross-sectional view of a non-volatile memory showing a programming operation through source-side injection effect according to one embodiment of the present invention.

FIG. 2 is a schematic cross-sectional view of a non-volatile memory showing a programming operation through source-side injection effect according to one embodiment of the present invention. As shown in FIG. 2, two adjacent memory cells 202, 222 disposed on the semiconductor substrate 200 is provided. The memory cell 202 comprises a gate 204, a gate dielectric layer 206, two storage units 208, 210 and two assist gates 212, 214. Similarly, the memory cell 222 comprises a gate 224, a gate dielectric layer 226, two storage units 228, 230 and two assist gate 214, 232. The gate, the storage units and the assist gates are electrically isolated from one another through insulating material, for example, dielectric layers 216, 218. Since the disposition, material and fabricating method of the various elements in the memory cells 202, 222 has been discussed in the aforementioned embodiment, a detailed description is not repeated here.

To program the storage unit 208 within the memory cell 202, an inversion region 240 is formed in the semiconductor substrate 200 underneath the gate 224, an inversion region 242 is formed in the semiconductor substrate 200 underneath the gate 214, an inversion region 240 is formed in the semiconductor substrate 200 underneath the assist gate 212, a first voltage such as 0V is applied to the inversion region 240, a second voltage such as between 4~7V is applied to the inversion region 244 such that the first voltage is smaller than the second voltage, and a third voltage such as a between 12~14V is applied to the gate 204 on the memory cell 202 to form a channel region 246 in the semiconductor substrate 200 underneath the gate 204. Through the aforementioned setup, a voltage differential is set up between the inversion region 240 and the inversion region 244 so that source side injection (SSI) is triggered to program the storage unit 208. In another embodiment, an inversion region 240 is also formed in the semiconductor substrate 200 underneath the assist gate 232. Furthermore, a fourth voltage such as 0V can be applied to the semiconductor substrate 200.

The inversion region 242 is a floating inversion region, for example. In other words, no voltage is applied to the inversion region 242. The method of forming the inversion region 240 includes applying a fifth voltage, for example, a voltage between 12V~14V, to the gate 224 and applying a sixth voltage, for example, a voltage between 4V~7V, to the assist gate 232. Furthermore, the method of forming the inversion region 242 includes applying a seventh voltage, for example, a voltage between 1V~2V, to the assist gate 214. On the other hand, the method of forming the inversion region 244 includes applying an eighth voltage, for example, a voltage between 7V~10V, to the assist gate 212.

In the aforementioned embodiment, through the formation of the inversion regions 240, 242 and 244 and a voltage differential between the inversion region 240 and 244 in the semiconductor substrate 200, source side injection is triggered to program data into the storage unit 208. Consequently, a faster operating speed is produced in the non-volatile memory and a lower programming current is required to perform the programming operation.

Figure 3:
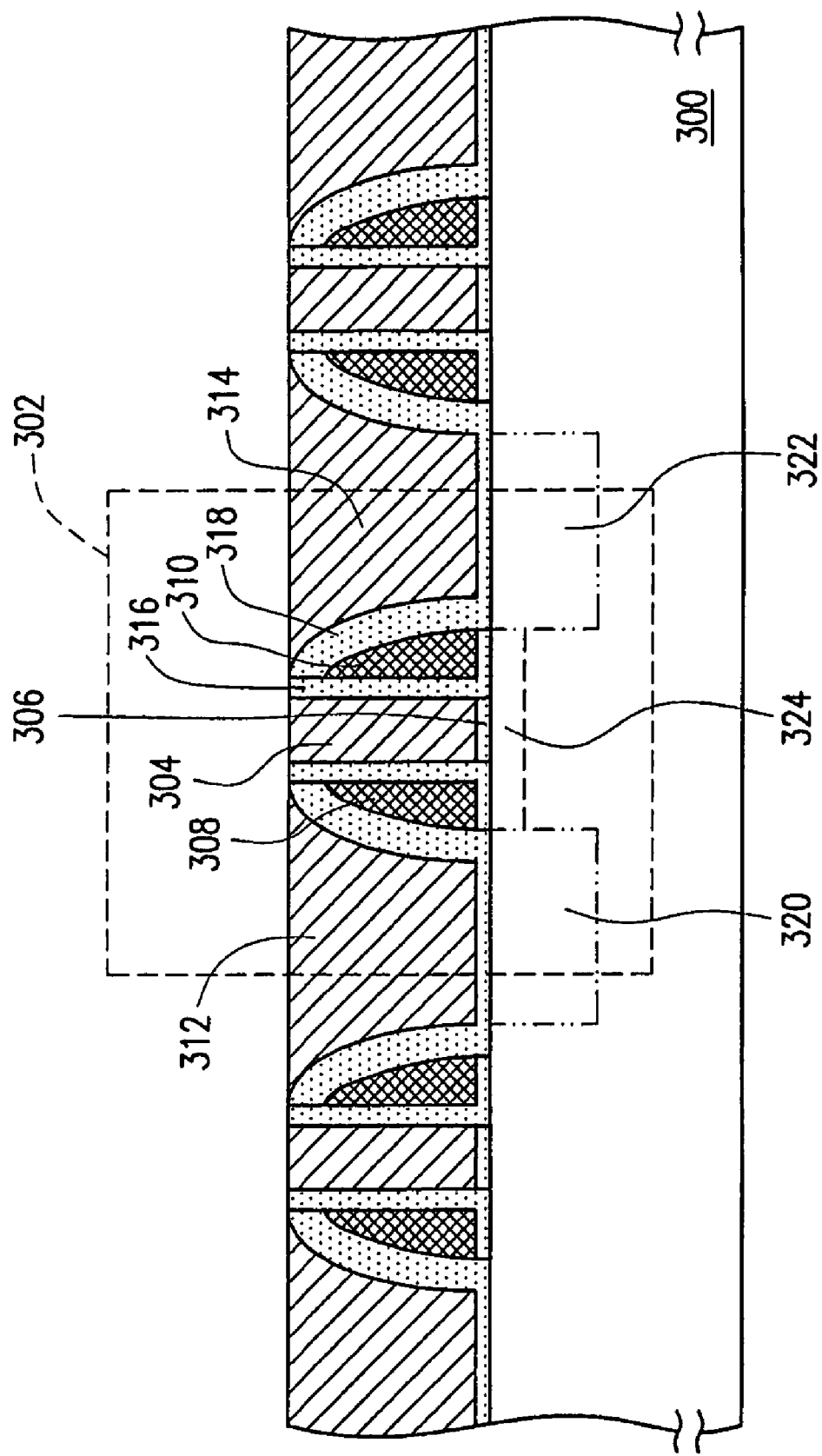
FIG. 3 is a schematic cross-sectional view of a non-volatile memory showing a programming operation through channel hot electron injection effect according to one embodiment of the present invention.

FIG. 3 is a schematic cross-sectional view of a non-volatile memory showing a programming operation through channel hot electron injection effect according to one embodiment of the present invention. As shown in FIG. 3, using the memory cell 302 on the semiconductor substrate 300 as an example, the memory cell 302 comprises a gate 304, a gate dielectric layer 306, two storage units 308, 310 and two assist gates 312, 314. The gate, the storage units and the assist gates are electrically isolated from one another through insulating material such as dielectric layers 316, 318, for example. Since the disposition, material and fabricating method of the various elements in the memory cell 302 has been discussed in the aforementioned embodiment, a detailed description is not repeated here.

To program the storage unit 308 within the memory cell 302, an inversion region 320 is formed underneath the assist gate 312, an inversion region 322 is formed underneath the assist gate 314 on another side of the memory cell 302, a ninth voltage, for example, a voltage between 4V~6V, is applied to the inversion region 320, a tenth voltage of about 0V, for example, is applied to the inversion region 322 such that the ninth voltage is greater than the tenth voltage, and an eleventh voltage of about 10V is applied to the gate 304 on the memory cell 302 to form a channel region 324 in the semiconductor substrate 300 underneath the gate 304. Through the aforementioned setup, a voltage differential is set up between the inversion region 320 and the inversion region 322 so that channel hot electron injection (CHEI) is triggered to program the storage unit 308. In another embodiment, a twelfth voltage such as 0V can be applied to the semiconductor substrate 300.

The method of forming the inversion region 320 includes applying a thirteenth voltage, for example, a voltage between 5V~8V, to the assist gate 312. Furthermore, the method of forming the inversion region 322 includes applying a fourteenth voltage, for example, a voltage between 4V~6V, to the assist gate 314.

In the aforementioned embodiment, through the application of voltages to the gate 304 and the assist gates 312, 314 to form the inversion regions 320 and 322 and a voltage differential between the inversion region 320 and 322 in the semiconductor substrate 300, channel hot electron injection is triggered to program data into the storage unit 308. Hence, there is no need to program through the doped source region and drain region in a conventional method. Consequently, aside from simplifying the process of fabricating a non-volatile memory, overall production cost is also reduced. Moreover, through the channel hot electron injection, the programming speed in also increased.

Figure 4:
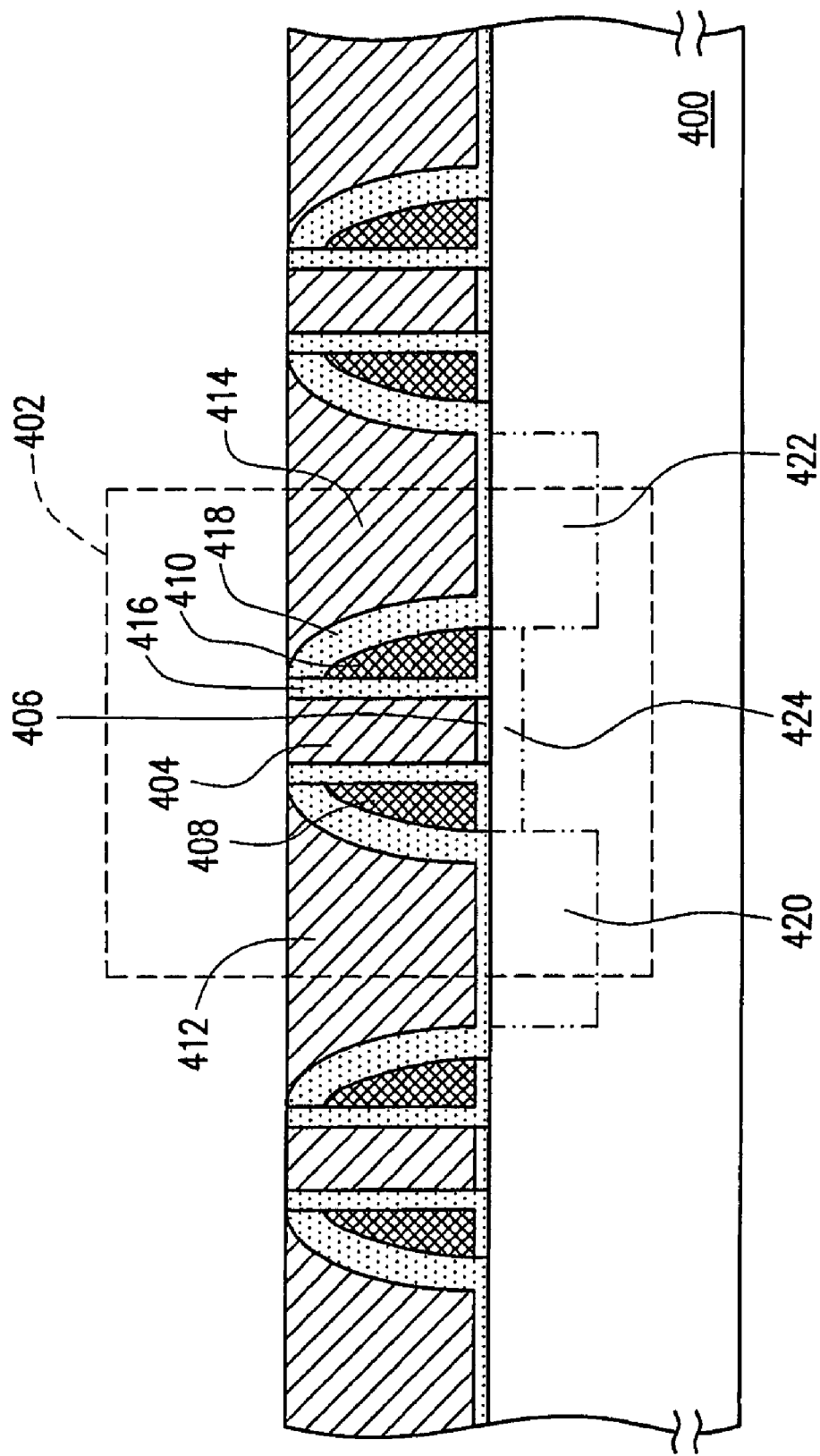
FIG. 4 is a schematic cross-sectional view of a non-volatile memory showing a programming operation through channel initiated secondary hot electron injection effect according to one embodiment of the present invention.
Figure 5:
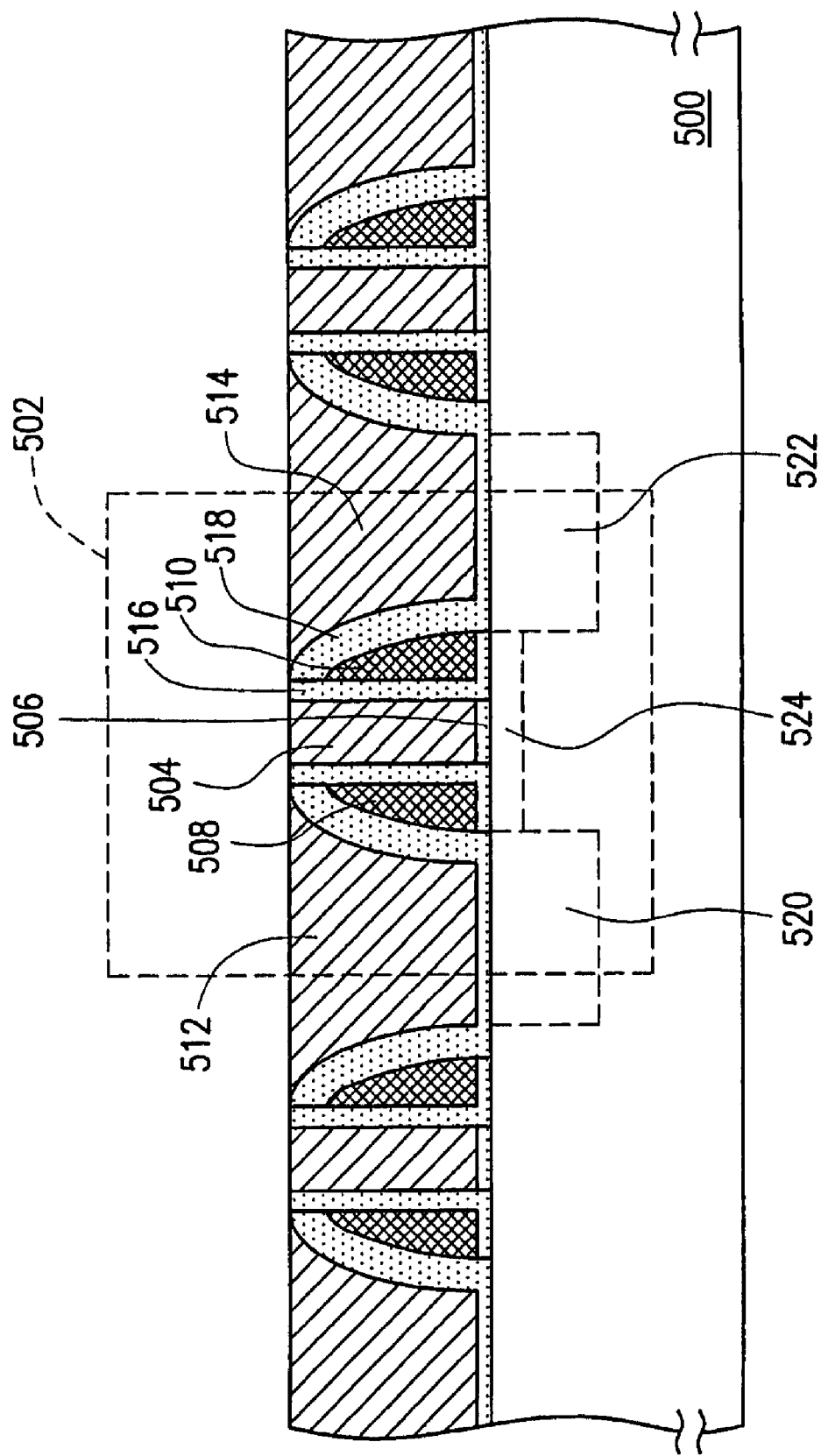
FIG. 5 is a schematic cross-sectional view of a non-volatile memory showing a reading operation according to one embodiment of the present invention.

FIG. 4 is a schematic cross-sectional view of a non-volatile memory showing a programming operation through channel initiated secondary hot electron injection effect according to one embodiment of the present invention. As shown in FIG. 4, using the memory cell 402 on the semiconductor substrate 400 as an example, the memory cell 402 comprises a gate 404, a gate dielectric layer 406, two storage units 408, 410 and two assist gates 412, 414. The gate, the storage units and the assist gates are electrically isolated from one another through insulating material such as dielectric layers 416, 418, for example.

Since the disposition, material and fabricating method of the various elements in the memory cell 402 has been discussed in the aforementioned embodiment, a detailed description is not repeated here.

To program the storage unit 408 within the memory cell 402, an inversion region 420 is formed underneath the assist gate 412, an inversion region 422 is formed underneath the assist gate 414 on another side of the memory cell 402, a fifteenth voltage, for example, a voltage between 4V~6V, is applied to the inversion region 420, a sixteenth voltage of about 0V, for example, is applied to the inversion region 422 such that the fifteenth voltage is greater than the sixteenth voltage, and a seventeenth voltage of about 10V is applied to the gate 404 on the memory cell 402 to form a channel region 424 in the semiconductor substrate 400 underneath the gate 404. Through the aforementioned setup, a voltage differential is set up between the inversion region 420 and the inversion region 422 so that channel initiated secondary hot electron injection (CHISEL) is triggered to program the storage unit 408. In another embodiment, an eighteenth voltage, for example, a voltage of about –3V, can be applied to the semiconductor substrate 400.

The method of forming the inversion region 420 includes applying a nineteenth voltage, for example, a voltage between 5V~8V, to the assist gate 412. Furthermore, the method of forming the inversion region 422 includes applying a twentieth voltage, for example, a voltage between 4V~6V, to the assist gate 414.

In the aforementioned embodiment, through the application of voltages to the gate 404 and the assist gates 412, 414 to form the inversion regions 420 and 422 and a voltage differential between the inversion region 420 and 422 in the semiconductor substrate 400, channel initiated secondary hot electron injection is triggered to program data into the storage unit 408. Hence, there is no need to program through the doped source region and drain region in a conventional method. Consequently, aside from simplifying the process of fabricating a non-volatile memory, overall production cost is also reduced. Moreover, through the channel initiated secondary hot electron injection, a lower power rating can be used to perform the programming operation. Thus, a faster programming speed and a better convergence characteristic can be obtained.

To read from the storage unit 508 within the memory cell 502, an inversion region 520 is formed underneath the assist gate 512, an inversion region 522 is formed underneath the assist gate 514 on another side of the memory cell 502, a twenty-first voltage, for example, a 0V, is applied to the inversion region 520, a twenty-second voltage, for example, a voltage between 1V~4V, is applied to the inversion region 522 such that the twenty first voltage is greater than the twenty second voltage, and a twenty-third voltage, for example, a voltage between 3V~5V, is applied to the gate 504 on the memory cell 502 to form a channel region 524 in the semiconductor substrate 500 underneath the gate 504. Through the aforementioned setup, a voltage differential is set up between the inversion region 520 and the inversion region 522 for reading data from the storage unit 508. In one preferred embodiment, a twenty-fourth voltage, for example, a voltage of about 0V, can be applied to the semiconductor substrate 500.

The method of forming the inversion region 520 includes applying a twenty-fifth voltage, for example, a voltage between 4V~7V, to the assist gate 512. Furthermore, the method of forming the inversion region 522 includes applying a twenty-sixth voltage, for example, a voltage between 4V~7V, to the assist gate 514.

In the aforementioned embodiment, through the application of voltages to the gate 504 and the assist gates 512, 514 to form the inversion regions 520 and 522 and a voltage differential between the inversion region 520 and 522 in the semiconductor substrate 500, data is read from the storage unit 508. Hence, there is no need to read through the doped source region and drain region in a conventional method. Consequently, aside from simplifying the process of fabricating a non-volatile memory, overall production cost is also reduced.

Figure 6:
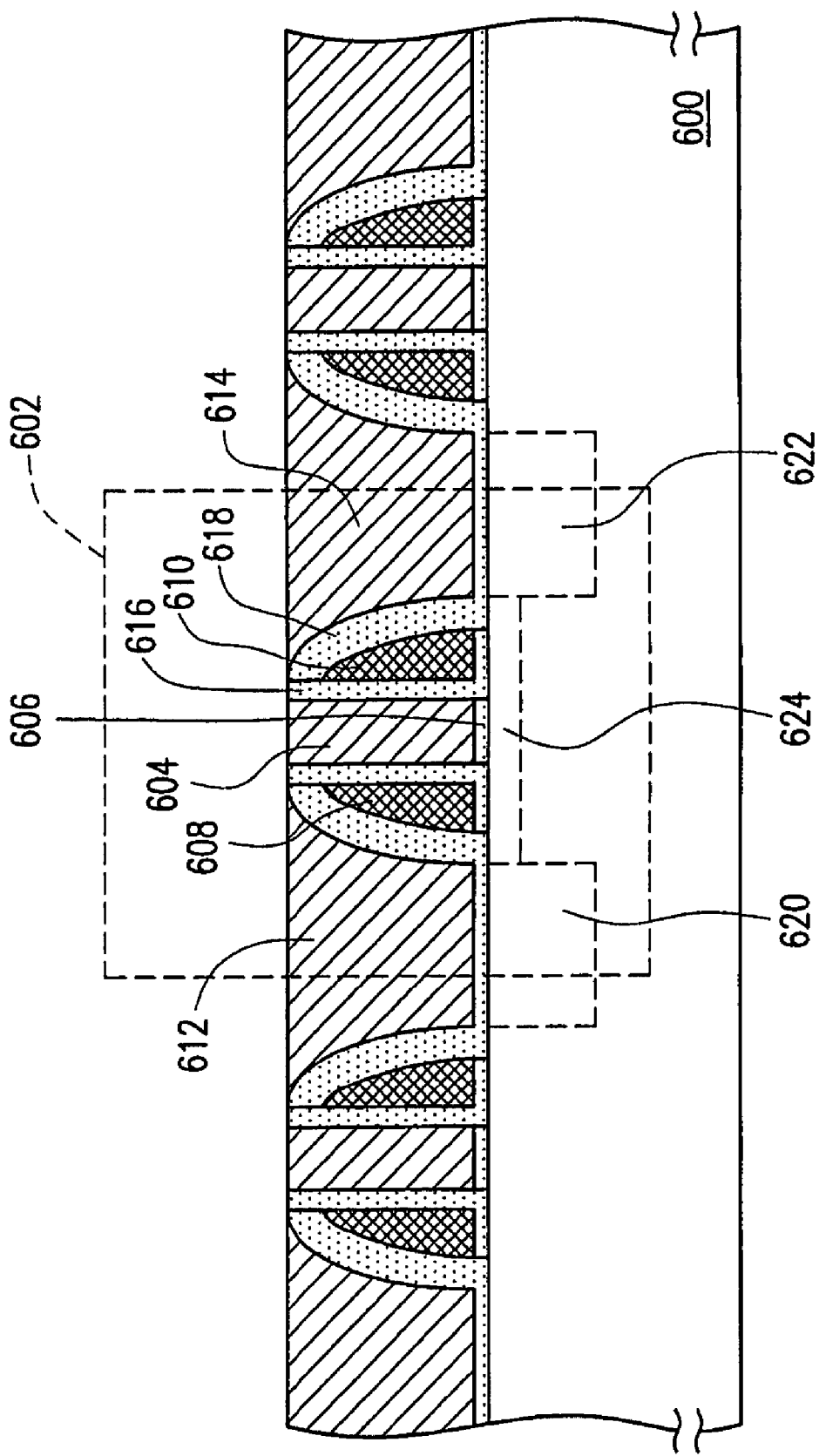
FIG. 6 is a schematic cross-sectional view of a non-volatile memory showing an erasing operation according to one embodiment of the present invention.

FIG. 6 is a schematic cross-sectional view of a non-volatile memory showing an erasing operation according to one embodiment of the present invention. As shown in FIG. 6, using the memory cell 602 on the semiconductor substrate 600 as an example, the memory cell 602 comprises a gate 604, a gate dielectric layer 606, two storage units 608, 610 and two assist gates 612, 614. The gate, the storage units and the assist gates are electrically isolated from one another through insulating material such as dielectric layers 616, 618, for example. Since the disposition, material and fabricating method of the various elements in the memory cell 602 has been discussed in the aforementioned embodiment, a detailed description is not repeated here.

To erase data from the storage unit 608 within the memory cell 602, an inversion region 620 is formed underneath the assist gate 612, an inversion region 622 is formed underneath the assist gate 614 on another side of the memory cell 602, a twenty-seventh voltage, for example, a voltage between 4V~6V, is applied to the inversion region 620, a twenty-eighth voltage of about 0V, for example, is applied to the inversion region 622 such that the twenty-seventh voltage is greater than the twenty-eighth voltage, and a twenty-ninth voltage, for example, a voltage between –3V~–5V, is applied to the gate 604 on the memory cell 602 to form a channel region 624 in the semiconductor substrate 600 underneath the gate 604. Through the aforementioned setup, a voltage differential is set up between the inversion region 620 and the inversion region 622 so that band-to-band hot hole effect is triggered to erase data from the storage unit 608. In another embodiment, a thirtieth voltage, for example, a voltage of about 0V, can be applied to the semiconductor substrate 600.

The method of forming the inversion region 620 includes applying a thirty-first voltage, for example, a voltage between 5V~8V, to the assist gate 612. Furthermore, the method of forming the inversion region 622 includes applying a thirty-second voltage, for example, a voltage between 4V~6V, to the assist gate 614.

In the aforementioned embodiment, the data within the storage unit 608 is erased. Because the storage unit 608 is set up on the sidewalls of the gate 604 and the gate dielectric layer 606, the difficulties of removing charges accumulated close to the central location of the channel of a conventional planar storage unit is eliminated.

Figure 7:
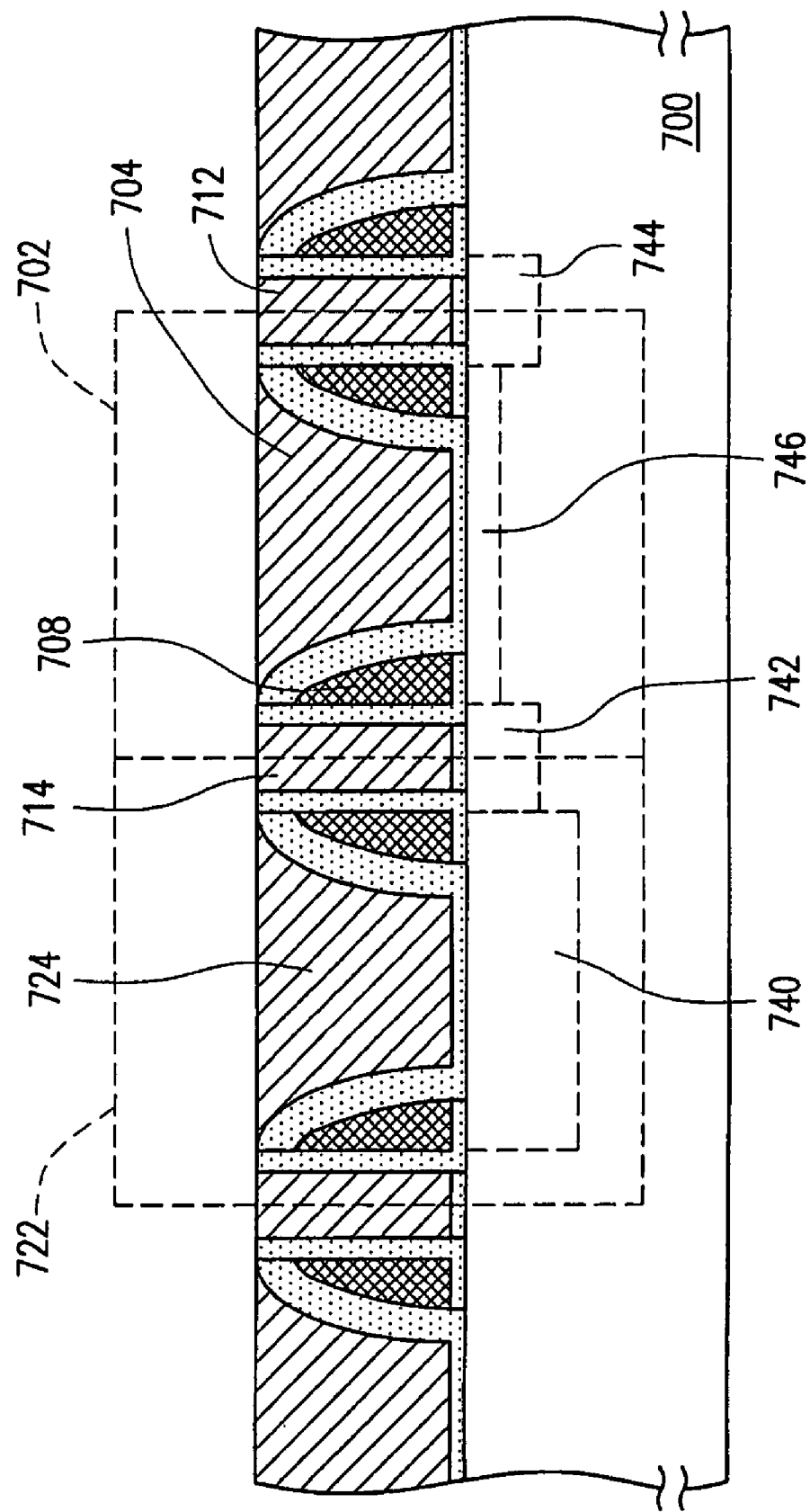
FIG. 7 is a schematic cross-sectional view of a non-volatile memory showing a programming operation through source-side injection effect according to another embodiment of the present invention.

In all the above embodiments, the operation of only one of the storage units inside a memory cell is described. However, anyone familiar with the technical field associated with the present invention may similarly apply the aforementioned embodiment to any one of the storage units in a memory cell array. As shown in FIG. 7, a source side injection can be carried out to program data into one of the memory cells when the configuration of the defined memory cell is similar to the memory cells 702 and 722. To program data into the storage unit 708 within the memory cell 702 through source side injection, a channel region 746 is formed in the semiconductor substrate 700 underneath the assist gate 704, inversion regions 744 and 740 are formed in the semiconductor substrate 700 underneath the gate 712 and the assist gate 724 respectively, a floating region 742 is formed in the semiconductor substrate 700 underneath the gate 714 such that the floating region 742 is a depletion region. Thereafter, a voltage is applied to the inversion regions 744, 740 underneath the gate 712 and the assist gate 724 respectively. The voltage applied to the inversion region 744 is greater than the voltage applied to the inversion region 740 so that the two inversion regions produce a biased voltage to program the storage unit 228.

In summary, the present invention has at least the following advantages:
1. The storage units in the non-volatile memory are disposed on each side of the gate and the inversion bit line replaces the conventional doped source and drain region. Hence, the dimensions of each memory cell are reduced and the level of integration of the device is increased so that a higher storage density is obtained.
2. Because an inversion bit line is used instead of a doped source or drain region, the fabrication process is very much simplified and the production cost is reduced.
3. The non-volatile memory is programmed through source side injection. Hence, a higher programming speed is attained and a smaller programming current is required.
4. The method of programming the non-volatile memory includes using channel initiated secondary hot electron injection. Hence, programming can be carried out at a lower power rating and at a higher programming speed so that a better convergence characteristic is obtained.
5. The method of operating the non-volatile memory includes using channel hot electron injection so that the programming speed is increased.
6. The method of erasing data from the non-volatile memory according to the present invention also minimizes the difficulties of removing charges accumulated close to the central region of a channel within the planar storage unit of a conventional non-volatile memory.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of programming a non-volatile memory, in particular, a memory cell array having at least two memory cells, a first memory cell and a second memory cell such that each memory cell comprises: a first gate disposed on a substrate, a pair of storage units disposed on the respective sidewalls of the first gate, a second gate and a third gate disposed on the respective sides of the first gate and adjacent to the storage units on the sidewalls of the first gate, wherein the first gate, the storage units, the second gate and the third gate are electrically isolated from one another, and the third gate of the first memory cell is the second gate of the second memory cell, the method comprising the steps of:
    programming the storage unit in the first memory cell close to the second memory cell by forming a first inversion region in the substrate underneath the first gate of the second memory cell and the third gate of the second memory cell, forming a second inversion region in the substrate underneath the third gate of the first memory cell, forming a third inversion region in the substrate underneath the second gate of the first memory cell, applying a first voltage to the first inversion region, applying a second voltage to the third inversion region such that the first voltage is smaller than the second voltage, applying a third voltage to the first gate of the first memory cell so that source side injection is triggered to program data into the selected storage unit.

2. The programming method of claim 1, wherein the second inversion region includes a floating inversion region.

3. The programming method of claim 1, wherein the method of forming the second inversion region includes applying a fifth voltage to the third gate of the first memory cell.

4. The programming method of claim 1, wherein the method of forming the first inversion region includes applying a fourth voltage to the first gate of the second memory cell.

5. The programming method of claim 1, wherein the method of forming the third inversion region includes applying a sixth voltage to the second gate of the first memory cell.

6. The programming method of claim 1, wherein the method also includes applying a seventh voltage to the substrate.

7. A method of programming a non-volatile memory, in particular, a memory cell array having a plurality of memory cells such that each memory cell comprises: a first gate disposed on a substrate, a pair of storage units disposed on the respective sidewalls of the first gate, two second gates disposed on the respective sides of the first gate and adjacent to the storage units on the sidewalls of the first gate, and each second gate is shared between two adjacent memory cells, wherein the first gate, the storage units and the second gates are electrically isolated from one another, the method comprising the steps of:
    programming the storage unit on one side of the selected memory cell by forming a first inversion region underneath the second gate on the selected memory cell and on the same side as the selected storage unit, forming a second inversion region underneath the second gate on the other side of the selected memory cell, applying a first voltage to the first inversion region, applying a second voltage to the second inversion region such that the first voltage is greater than the second voltage, applying a third voltage to the first gate of the selected memory cell so that channel hot electron injection (CHEI) is triggered to program the selected storage unit.

8. The programming method of claim 7, wherein the method of forming the first inversion region includes applying a fourth voltage to the second gate on the select memory cell and on the same side as the selected storage unit.

9. The programming method of claim 7, wherein the method of forming the second inversion region includes applying a fifth voltage to the second gate on the other side of the selected memory cell.

10. The programming method of claim 7, wherein the method also includes applying a sixth voltage to the substrate.

11. A method of programming a non-volatile memory, in particular, a memory cell array having a plurality of memory cells such that each memory cell comprises: a first gate disposed on a substrate, a pair of storage units disposed on the respective sidewalls of the first gate, two second gates disposed on the respective sides of the first gate and adjacent to the storage units on the sidewalls of the first gate, and each second gate is shared between two adjacent memory cells, wherein the first gate, the storage units and the second gates are electrically isolated from one another, the method comprising the steps of:
    programming the storage unit on one side of the selected memory cell by forming a first inversion region underneath the second gate on the selected memory cell and on the same side as the selected storage unit, forming a second inversion region underneath the second gate on the other side of the selected memory cell, applying a first voltage to the first inversion region, applying a second voltage to the second inversion region such that the first voltage is greater than the second voltage, applying a third voltage to the first gate of the selected memory cell so that channel initiated secondary hot electron injection (CHISEL) is triggered to program the selected storage unit.

12. The programming method of claim 11, wherein the method of forming the first inversion region includes applying a fourth voltage to the second gate on the select memory cell and on the same side as the selected storage unit.

13. The programming method of claim 11, wherein the method of forming the second inversion region includes applying a fifth voltage to the second gate on the other side of the selected memory cell.

14. The programming method of claim 12, wherein the method also includes applying a sixth voltage to the substrate.

* * * * *